US011239170B2

(12) United States Patent
Franz et al.

(10) Patent No.: US 11,239,170 B2
(45) Date of Patent: Feb. 1, 2022

(54) STACKED MODULES

(71) Applicant: SNAPTRACK, INC., San Diego, CA (US)

(72) Inventors: Andreas Franz, Vaterstetten (DE); Jürgen Portmann, Munich (DE); Claus Reitlinger, Wolnzach (DE); Stefan Kiefl, Munich (DE); Oliver Freudenberg, Zorneding (DE); Karl Weidner, Munich (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 16/305,008

(22) PCT Filed: Dec. 2, 2016

(86) PCT No.: PCT/EP2016/079607
§ 371 (c)(1),
(2) Date: Nov. 27, 2018

(87) PCT Pub. No.: WO2017/215771
PCT Pub. Date: Dec. 21, 2017

(65) Prior Publication Data
US 2019/0164892 A1 May 30, 2019

(30) Foreign Application Priority Data
Jun. 14, 2016 (DE) .......................... 102016110862.6

(51) Int. Cl.
*H01L 23/538* (2006.01)
*H01L 23/31* (2006.01)
(Continued)

(52) U.S. Cl.
CPC ........ *H01L 23/5385* (2013.01); *H01L 21/561* (2013.01); *H01L 21/565* (2013.01);
(Continued)

(58) Field of Classification Search
CPC ............ H01L 23/5385; H01L 23/3107; H01L 23/3736; H01L 23/49805; H01L 23/49822;
(Continued)

(56) References Cited

U.S. PATENT DOCUMENTS 5,857,858 A * 1/1999 Gorowitz ............ H01L 25/0652
257/686
5,977,640 A * 11/1999 Bertin ................. H01L 25/0657
257/686
(Continued)

FOREIGN PATENT DOCUMENTS

CN          1441613 A       9/2003
CN        103730447 A       4/2014
(Continued)

OTHER PUBLICATIONS

International Search Report and Written Opinion—PCT/EP2016/079607—ISA/EPO—dated May 4, 2017.
(Continued)

*Primary Examiner* — Ida M Soward
(74) *Attorney, Agent, or Firm* — Patterson & Sheridan, LLP

(57) ABSTRACT

The present invention relates to a module that has a lower component of a module (1) having a material (3) in which at least one first structural element (4) is embedded, and an upper component of a module (2) having a material (3) in which at least a second component (16) is embedded. The upper component of the module (2) and the lower component of the module (1) are stacked, with the lower and the upper component of the module (2) being electrically connected and mechanically linked to each other. In addition, the present invention relates to a simple and cost-effective process for the production of a variety of modules. The invention makes it possible for the modules to be miniatur-
(Continued)

ized with respect to surface and height and/or makes it possible to achieve greater integration by 3D packaging.

10 Claims, 3 Drawing Sheets

(51) Int. Cl.
<table>
<tr><td>H01L 23/373</td><td>(2006.01)</td></tr>
<tr><td>H01L 23/49</td><td>(2006.01)</td></tr>
<tr><td>H01L 23/66</td><td>(2006.01)</td></tr>
<tr><td>H01L 25/10</td><td>(2006.01)</td></tr>
<tr><td>H01L 25/16</td><td>(2006.01)</td></tr>
<tr><td>H01L 25/11</td><td>(2006.01)</td></tr>
<tr><td>H01L 25/065</td><td>(2006.01)</td></tr>
<tr><td>H01L 25/07</td><td>(2006.01)</td></tr>
<tr><td>H01L 23/00</td><td>(2006.01)</td></tr>
<tr><td>H01L 25/00</td><td>(2006.01)</td></tr>
<tr><td>H01L 23/552</td><td>(2006.01)</td></tr>
<tr><td>H01L 23/498</td><td>(2006.01)</td></tr>
<tr><td>H01L 21/56</td><td>(2006.01)</td></tr>
<tr><td>H01L 23/367</td><td>(2006.01)</td></tr>
</table>

(52) U.S. Cl.
CPC ...... *H01L 23/3107* (2013.01); *H01L 23/3736* (2013.01); *H01L 23/49805* (2013.01); *H01L 23/49822* (2013.01); *H01L 23/5389* (2013.01); *H01L 23/552* (2013.01); *H01L 23/66* (2013.01); *H01L 24/19* (2013.01); *H01L 24/20* (2013.01); *H01L 24/32* (2013.01); *H01L 24/83* (2013.01); *H01L 24/96* (2013.01); *H01L 24/97* (2013.01); *H01L 25/105* (2013.01); *H01L 25/16* (2013.01); *H01L 25/50* (2013.01); *H01L 23/367* (2013.01); *H01L 23/49811* (2013.01); *H01L 23/5384* (2013.01); *H01L 24/13* (2013.01); *H01L 24/16* (2013.01); *H01L 24/17* (2013.01); *H01L 24/81* (2013.01); *H01L 25/0652* (2013.01); *H01L 25/071* (2013.01); *H01L 25/112* (2013.01); *H01L 25/117* (2013.01); *H01L 2223/6677* (2013.01); *H01L 2224/04105* (2013.01); *H01L 2224/12105* (2013.01); *H01L 2224/131* (2013.01); *H01L 2224/13564* (2013.01); *H01L 2224/13611* (2013.01); *H01L 2224/24137* (2013.01); *H01L 2224/24195* (2013.01); *H01L 2224/73204* (2013.01); *H01L 2224/81193* (2013.01); *H01L 2224/81805* (2013.01); *H01L 2224/96* (2013.01); *H01L 2225/06548* (2013.01); *H01L 2225/107* (2013.01); *H01L 2225/1011* (2013.01); *H01L 2225/1035* (2013.01); *H01L 2225/1041* (2013.01); *H01L 2225/1058* (2013.01); *H01L 2225/1064* (2013.01); *H01L 2225/1082* (2013.01); *H01L 2225/1088* (2013.01); *H01L 2225/1094* (2013.01); *H01L 2924/143* (2013.01); *H01L 2924/1431* (2013.01); *H01L 2924/1434* (2013.01); *H01L 2924/1461* (2013.01); *H01L 2924/1815* (2013.01); *H01L 2924/18162* (2013.01); *H01L 2924/19105* (2013.01); *H01L 2924/3025* (2013.01); *H01L 2924/3511* (2013.01)

(58) Field of Classification Search
CPC ... H01L 23/5389; H01L 23/552; H01L 23/66; H01L 24/19; H01L 24/20; H01L 24/32; H01L 24/83; H01L 24/96; H01L 24/97; H01L 25/105; H01L 25/16; H01L 25/50; H01L 25/117; H01L 25/0652; H01L 25/071; H01L 25/112; H01L 2225/1011; H01L 2225/06548

See application file for complete search history.

(56) References Cited

U.S. PATENT DOCUMENTS

<table>
<tr><td>6,093,969</td><td>A *</td><td>7/2000</td><td>Lin</td><td>H01L 23/24<br>257/777</td></tr>
<tr><td>7,005,764</td><td>B2 *</td><td>2/2006</td><td>Petersen</td><td>H02K 16/04<br>310/112</td></tr>
<tr><td>7,919,844</td><td>B2 *</td><td>4/2011</td><td>Ozguz</td><td>H01L 21/4803<br>257/686</td></tr>
<tr><td>8,008,121</td><td>B2 *</td><td>8/2011</td><td>Choi</td><td>H01L 24/29<br>438/107</td></tr>
<tr><td>8,763,242</td><td>B2 *</td><td>7/2014</td><td>Kawano</td><td>H01L 23/66<br>29/841</td></tr>
<tr><td>8,786,060</td><td>B2</td><td>7/2014</td><td>Yen et al.</td><td></td></tr>
<tr><td>9,064,941</td><td>B2</td><td>6/2015</td><td>Jung et al.</td><td></td></tr>
<tr><td>9,107,290</td><td>B1 *</td><td>8/2015</td><td>Chen</td><td>H01L 23/49811</td></tr>
<tr><td>9,131,634</td><td>B2 *</td><td>9/2015</td><td>Hadjichristos</td><td>H04B 1/40</td></tr>
<tr><td>9,349,708</td><td>B2 *</td><td>5/2016</td><td>Fu</td><td>H01L 23/481</td></tr>
<tr><td>9,349,711</td><td>B2 *</td><td>5/2016</td><td>Lin</td><td>H01L 23/5385</td></tr>
<tr><td>9,502,380</td><td>B2 *</td><td>11/2016</td><td>Lin</td><td>H01L 24/96</td></tr>
<tr><td>10,056,351</td><td>B2 *</td><td>8/2018</td><td>Yu</td><td>H01L 23/3128</td></tr>
<tr><td>10,128,205</td><td>B2 *</td><td>11/2018</td><td>Meyer</td><td>G06F 1/1613</td></tr>
<tr><td>10,276,541</td><td>B2 *</td><td>4/2019</td><td>Chen</td><td>H01L 21/76804</td></tr>
<tr><td>10,305,444</td><td>B2 *</td><td>5/2019</td><td>Iwamoto</td><td>H04B 1/006</td></tr>
<tr><td>10,483,250</td><td>B2 *</td><td>11/2019</td><td>Nair</td><td>H01L 23/48</td></tr>
<tr><td>10,490,540</td><td>B2 *</td><td>11/2019</td><td>Yu</td><td>H01L 25/50</td></tr>
<tr><td>10,748,873</td><td>B2 *</td><td>8/2020</td><td>Guo</td><td>H01L 24/73</td></tr>
<tr><td>2002/0066952</td><td>A1</td><td>6/2002</td><td>Taniguchi et al.</td><td></td></tr>
<tr><td>2003/0203663</td><td>A1 *</td><td>10/2003</td><td>Burns</td><td>H01L 23/49537<br>439/67</td></tr>
<tr><td>2005/0146854</td><td>A1 *</td><td>7/2005</td><td>Ikuta</td><td>H01L 23/3677<br>361/719</td></tr>
<tr><td>2006/0092079</td><td>A1 *</td><td>5/2006</td><td>de Rochemont</td><td>H01Q 5/307<br>343/700 MS</td></tr>
<tr><td>2007/0090521</td><td>A1 *</td><td>4/2007</td><td>Imaizumi</td><td>H01L 23/49575<br>257/723</td></tr>
<tr><td>2008/0036050</td><td>A1 *</td><td>2/2008</td><td>Lin</td><td>B29C 45/14655<br>257/659</td></tr>
<tr><td>2008/0157316</td><td>A1</td><td>7/2008</td><td>Yang</td><td></td></tr>
<tr><td>2009/0236731</td><td>A1</td><td>9/2009</td><td>Shim et al.</td><td></td></tr>
<tr><td>2010/0044845</td><td>A1 *</td><td>2/2010</td><td>Funaya</td><td>H01L 21/6835<br>257/685</td></tr>
<tr><td>2011/0248389</td><td>A1</td><td>10/2011</td><td>Yorita et al.</td><td></td></tr>
<tr><td>2013/0075926</td><td>A1 *</td><td>3/2013</td><td>Bae</td><td>H01L 25/105<br>257/774</td></tr>
<tr><td>2013/0181786</td><td>A1 *</td><td>7/2013</td><td>Furutani</td><td>H01P 1/36<br>333/1.1</td></tr>
<tr><td>2013/0256836</td><td>A1 *</td><td>10/2013</td><td>Hsiao</td><td>H01L 24/32<br>257/532</td></tr>
<tr><td>2013/0277821</td><td>A1 *</td><td>10/2013</td><td>Lundberg</td><td>H01L 25/0657<br>257/713</td></tr>
<tr><td>2013/0329376</td><td>A1 *</td><td>12/2013</td><td>Racz</td><td>H01L 21/6835<br>361/728</td></tr>
<tr><td>2014/0036464</td><td>A1</td><td>2/2014</td><td>Kilger</td><td></td></tr>
<tr><td>2014/0103488</td><td>A1 *</td><td>4/2014</td><td>Chen</td><td>H01L 24/19<br>257/532</td></tr>
<tr><td>2014/0264905</td><td>A1 *</td><td>9/2014</td><td>Lee</td><td>H01L 23/5389<br>257/774</td></tr>
<tr><td>2014/0367850</td><td>A1 *</td><td>12/2014</td><td>Wang</td><td>H01L 23/49811<br>257/737</td></tr>
<tr><td>2015/0041975</td><td>A1 *</td><td>2/2015</td><td>Chung</td><td>H01L 25/0657<br>257/737</td></tr>
<tr><td>2015/0119104</td><td>A1 *</td><td>4/2015</td><td>Saji</td><td>H04W 88/10<br>455/553.1</td></tr>
<tr><td>2015/0332937</td><td>A1 *</td><td>11/2015</td><td>Inoue</td><td>H01L 25/0657<br>438/113</td></tr>
<tr><td>2016/0035664</td><td>A1 *</td><td>2/2016</td><td>We</td><td>H01L 21/4853<br>257/686</td></tr>
<tr><td>2016/0049389</td><td>A1 *</td><td>2/2016</td><td>Chen</td><td>H01L 21/565<br>438/108</td></tr>
<tr><td>2016/0126219</td><td>A1 *</td><td>5/2016</td><td>Ashrafzadeh</td><td>H01L 25/16<br>257/531</td></tr>
</table>

(56) References Cited

U.S. PATENT DOCUMENTS

| | | | | |
|---|---|---|---|---|
| 2016/0254249 A1* | 9/2016 | Jeng | .................... | H01L 21/4857 |
| | | | | 257/692 |
| 2016/0358889 A1* | 12/2016 | Lai | ........................ | H01L 21/768 |
| 2017/0033079 A1* | 2/2017 | Lin | .................... | H01L 23/49894 |
| 2017/0062394 A1* | 3/2017 | Lin | ........................ | H01L 23/13 |
| 2017/0092594 A1* | 3/2017 | Song | ................... | H01L 21/4853 |
| 2017/0133353 A1* | 5/2017 | Lin | ........................ | H05K 1/183 |
| 2017/0141042 A1* | 5/2017 | Prabhu | ................ | H01L 21/4853 |
| 2017/0287874 A1* | 10/2017 | Fang | ....................... | H01L 24/24 |
| 2017/0301650 A1* | 10/2017 | Yu | ....................... | H01L 25/0652 |
| 2018/0145050 A1* | 5/2018 | Lu | ....................... | H01L 23/3735 |
| 2018/0197839 A1* | 7/2018 | Yu | ....................... | H01L 23/5386 |
| 2018/0226363 A1* | 8/2018 | Chen | ................... | H01L 21/565 |
| 2018/0226378 A1* | 8/2018 | Hung | ....................... | H01L 24/83 |
| 2018/0261571 A1* | 9/2018 | Haba | ....................... | H01L 25/105 |
| 2020/0135694 A1* | 4/2020 | Hung | ................. | H01L 21/4857 |
| 2020/0303275 A1* | 9/2020 | Huang | .................... | H01L 25/50 |

FOREIGN PATENT DOCUMENTS

| | | |
|---|---|---|
| CN | 104979315 A | 10/2015 |
| CN | 105518860 A | 4/2016 |
| DE | 102013107244 A1 | 6/2014 |
| JP | 2002170906 A | 6/2002 |
| JP | 2006186091 A | 7/2006 |
| KR | 20110048733 A | 5/2011 |
| WO | WO-2009122835 A1 | 10/2009 |

OTHER PUBLICATIONS

Partial International Search Report—PCT/EP2016/079607—ISA/EPO—dated Mar. 10, 2017.

\* cited by examiner

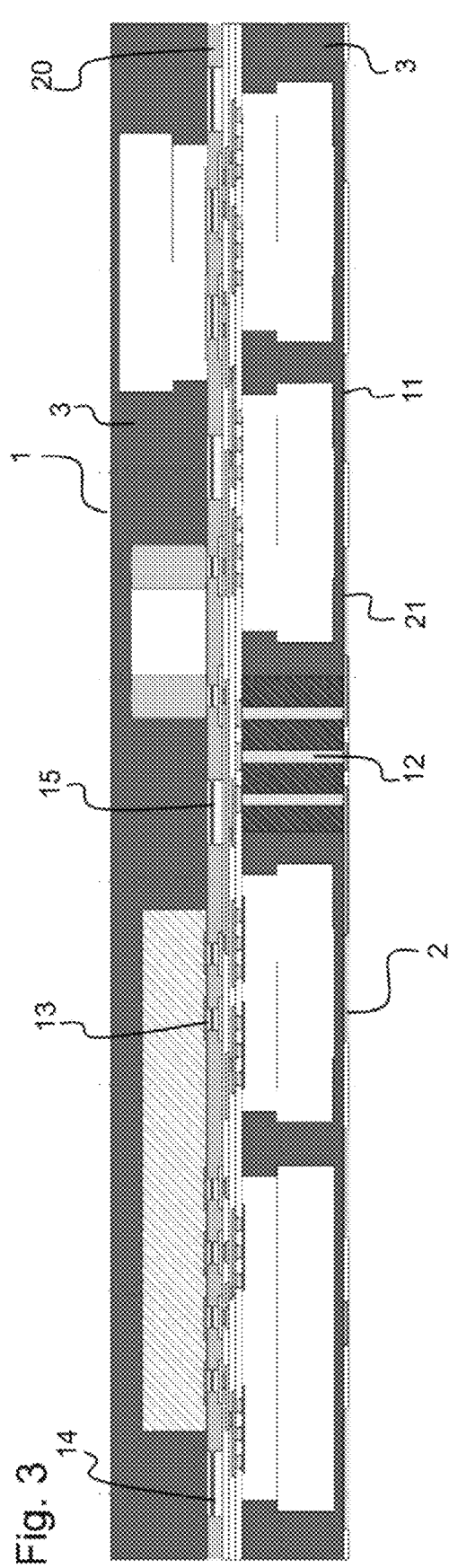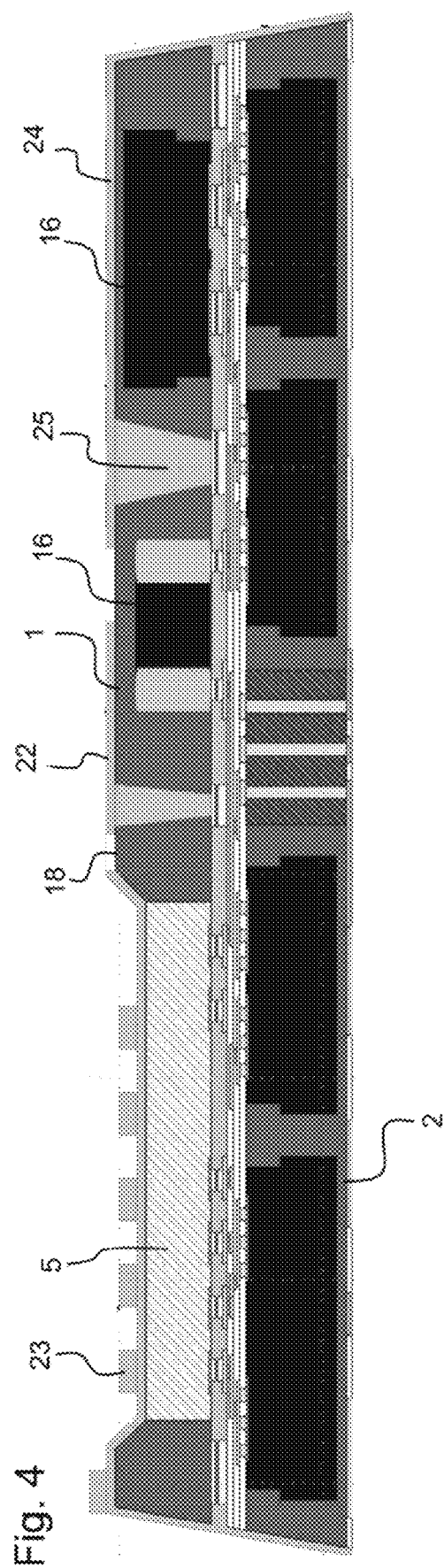

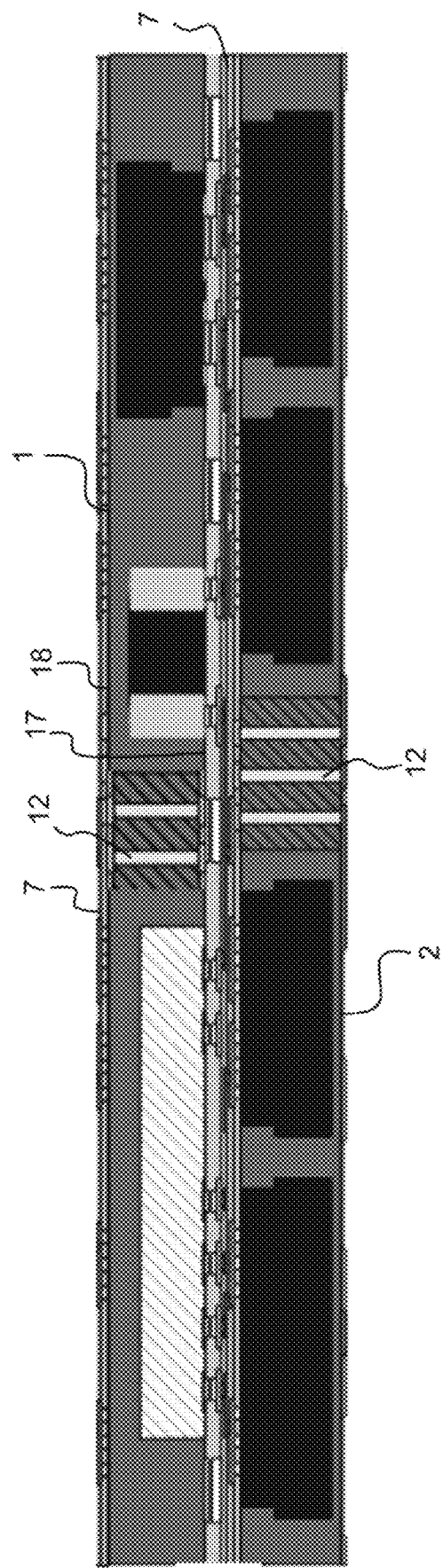

STACKED MODULES

CROSS-REFERENCE TO RELATED APPLICATIONS

This application is a national stage application under 35 U.S.C. 371 of PCT/EP2016/079607, filed Dec. 2, 2016, which claims the benefit of German Patent Application Serial No. 102016110862.6, filed on Jun. 14, 2016, both of which are incorporated herein by reference in their entireties.

The present invention relates to a module as well as to a process for the production of a variety of modules.

When developing modules, the goal is to continuously reduce the size of the modules while at the same time increasing the degree of integration, as well as simultaneously increasing the functionality of the modules. For the progressive integration of electric and electronic components in a module in the future, the available space is very limited. Therefore, it is required that novel structural and connection techniques be developed.

The object of the present invention is to provide an improved module that allows the level of integration of the module to be enhanced, for example. The module could be suitable in an industrial application or in the automotive sector, for example for use in a mobile device. A further object is to specify assembly and connection technology which makes it possible to produce such a module in a simple way.

The above problem is solved by a module according to the present claim 1. The other problem is solved by a process according to the second independent claim.

A module is proposed having a lower component of a module that has a material in which at least a first component is embedded, and an upper component of a module having a material in which at least a second component is embedded, with the upper component of the module and the lower component of the module being stacked and the lower and the upper component of the module being in electrical contact and mechanically connected.

The module is not confined to a design having only two components of the module. Rather, it can have additional components of the module stacked one above the other and in electrical contact and mechanically connected.

By stacking of the components of the module on top of each other, the module can increase its degree of integration into a third dimension, namely its height. Each of the components of the module can work as a technology platform in which any modular elements can be embedded. In this way, each of the components can be embedded in the material such that no additional solder joints are required for connecting components. In doing so, space requirements can be further reduced.

The stacking of the components of the module can make it possible to produce a module having short signal paths with low power consumption such that parasitic inductance can be reduced. For example, for modules with components forming a filter, it is possible to improve the properties of the filter.

The components of the module can be designed as technology platforms in which a variety of components can be integrated so that the module can be used for standardization since different types of components in each case can be embedded together in modular components which may be connected to each other.

The material having the lower and the upper components of the module may be a molding material, for example. The molding material can be selected such that it is suited to the embedded components. For example, to avoid mechanical stress when there are temperature fluctuations, the molding material and components can have a very similar coefficient of thermal expansion.

The material can also be an alternative to a prepreg material (Prepreg=preimpregnated fibers). The prepreg material can be applied using a pressure process or a lamination process. These materials can be applied with no bubbles in a pressure process or lamination process.

Alternatively, the material can be a glass substrate, a ceramic substrate, a PCB (PCBs=polychlorinated biphenyls), which can be single-sided or double-sided copper-coated.

The material of the lower component of the module and the material of the upper component of the module can be identical. It is also possible, however, to use different materials for the lower and the upper components of the module. In doing so, one of the above mentioned materials can be selected for each of the two components of the module.

In this connection, a unit can be called a module if it has at least two components and if it can be installed in a circuit arrangement. The module can have a housing in which the components of the module are encapsulated. The module can be set as a whole on a circuit board and be in electrical contact therewith.

At least one of the components of the module, on a side facing the other component of the module, in each case can have a rewiring layer having a layer of metal with which the components of the module are in electrical contact.

The rewiring layer can be single-layer or multi-layer. The rewiring layer may be produced by means of a photo-lithography process, for example. Alternatively, the rewiring layer may be produced by means of two-dimensional or three-dimensional printing processes or via laser structuring, for example by LDI (=laser direct imaging). LDI is a process in which photo-sensitive materials are cured using a laser. The metal layer of the rewiring layer may also be thickened later, for example by chemical or galvanic processes.

In addition, the metal layer may also be in electrical contact with the element embedded in the respective component of the module. Accordingly, the component may be in contact with elements of the respective other component of the module via the rewiring layer.

The metal layer in the rewiring layer can make it possible to transfer contact of the structural element that is arranged in the component of the module with respect to its position at the top or bottom of the module component. In this way the contacts of the individual structural elements can be arranged such that a high integration density can be achieved without two contacts being too close together. Thus, two contacts affecting one another in an undesirable manner can be avoided. Accordingly, via the rewiring layer, peripherally arranged contacts the structural elements can be wired in a flat arrangement on the respective outer surface, so that the distance between contact centers can be significantly increased.

The rewiring layer can thus allow increased design flexibility in the arrangement of the contacts on the upper and lower sides of the components of the module. The rewiring layer can be designed to be very thin, in particular significantly thinner than conventional substrates, so that the use of the rewiring layer entailed no significant increase in the thickness of the module. Rewiring layers can have a very high degree of precision in production.

In particular, each of the components of the module may have a rewiring layer on its upper and/or lower side by means of which it is in contact with the each adjacent component of the module in the stack. At least one of two components of the module stacked on top of each other can have a rewiring layer which is arranged on the sides facing the other component of the module.

At least one of the components of the module can have a rewiring layer on its lower side and on its opposite upper side, the rewiring layers being connected via a plated through hole extending through the component of the module.

The plated through hole provides electrical contact of the two rewiring layers. The through hole can be what are known as embedded Z lines. Embedded Z lines are thin strips having copper extending from the lower side of the lower module component to the upper side of the lower module component.

Alternatively or in addition to the plated through hole, special components having vertical electric lines or a structure of contacts on the outer edges of the module can be used for contacting a lower side of a component of the module with an upper side of the component of the module. Other common methods are also conceivable for producing electrically conductive indentations to connect a lower side of a component of the module to an upper side of the component of the module.

In one exemplary embodiment, the lower part of the module can have a rewiring layer on its upper side facing the upper module component which has a layer of metal, via which the lower component of the module is in electrical contact with the upper component of the module.

In one exemplary embodiment, the lower component of the module can have another rewiring layer on its lower side facing away from the upper component of the module which is associated with a plated through hole via which the additional rewiring layer is in electrical contact with the rewiring layer arranged on the top of the lower component of the module.

In one exemplary embodiment, the upper component of the module may have on its underside facing the lower component of the module a rewiring layer having a metal layer by means of which the upper component of the module is in electrical contact with the lower component of the module.

The first structural element or the second structural element may be a filter operating with acoustic waves. Such a structural element usually has a cavity. The structural element may have a housing within which the cavity is formed, the housing being embedded in the material. Due to the short signal paths resulting from the high degree of integration of the module, several filters with acoustic waves can be connected to each other in the module and filter properties can be improved by reducing parasitic inductances.

The lower component of the module can have metal columns on its upper side facing the upper component of the module. The upper component of the module can also have metal columns on its under side facing the lower part of the component of the module. The metal columns of the lower component of the module and the metal columns of the upper component of the module can be connected to each other.

The metal columns can be bonded in particular with eutectic bonding. In doing so, the metal columns can exhibit copper covered with a layer of tin. Copper and tin are suitable for eutectic bonding. Eutectic bonding can be executed with a high degree of precision and requires in particular structures having only a very minimal height. Accordingly, precision can be increased and at the same time the height of the connecting structures can be reduced compared to using solder balls for connecting, for example. In addition, the surface extension of the metal columns may be less than the minimum possible surface extension of a solder ball.

Metallization can be arranged on an exterior surface of the module to enable electromagnetic shielding of the module and/or to dissipate heat from the module. Metallization can also form an antenna structure.

On the upper side of the upper component of the module directed away from the lower component of the module, at least one further component of a module that has a material in which at least a third structural component is embedded can be arranged. In this way, almost any number of module components can be stacked one above the other. As a result, the degree of integration in the third dimension of the module can consistently be increased. In addition, at least one rewiring layer may be arranged in each case between two components of a module by means of which the two parts of the module are electrically contacted.

The material in which the first structural element and the second structural element are embedded can be a prepreg material, for example. This is characterized in particular by its good flowability. It makes simple layer formation possible as well as lamination of multiple layers together.

The first structural element and/or the second structural element can be selected from a semiconductor chip with a built-in active or passive circuit, a passive component, a sensor, a digital chip or a MEMS device. In addition to the actual sensor element, such a sensor can also have logic for evaluating measured data as well as a memory element. This variety of possible structural elements shows that the module can be a technology platform for the combination of various types or structural elements.

On its upper side facing away from the lower component of the module, the upper component of the module can have a rewiring layer with metallization that forms both an antenna structure and passive elements connected with the second component. Metallization thus serves a variety of purpose simultaneously s.

A further aspect of the present invention relates to a process for the manufacture of a variety of modules. The modules can be the described modules above. Accordingly, every structural and functional feature disclosed in connection with the module can also apply to the process. Every feature disclosed in connection with the process can also apply to the modules described above.

A process is proposed for the production of a plurality of modules each having a lower component of a module that has a material in which at least a first structural element is embedded and an upper component of a module having a material in which at least a second structural element is embedded, with the upper component of the module and the lower component of the module being stacked on one another and the lower and the upper components of the module being in electrical contact and mechanically connected. The process has the following steps:

Fabricating a lower wafer or a lower panel in which a variety of lower components of modules are arranged in the group.

Fabricating an upper wafer or an upper panel in which a plurality of upper components of modules are arranged in the group.

Attaching the lower wafer to the upper wafer or attaching the lower panel to the upper panel, and Separating the modules.

The steps are preferably performed in the order given here. Accordingly, a number of steps can be performed while the modules are in a wafer group or a panel group. In the group, a plurality of modules can be worked on at the same time in common work steps. Thus, production can be significantly simplified in this way. Since the separation of the modules takes place only after attaching the components of the module to each other, complex and expensive individual handling of module components can be avoided, in particular.

The lower and the upper wafer or the lower and the upper panel can be connected in particular by means of eutectic bonding, electrically conductive adhesive, sintering, or soldering. In particular, a connection using eutectic bonding offers many advantages, because this joining technique can be executed with a high degree of precision.

In the production of the lower wafer or the lower panel, the first structural element in a sheet molding process can be embedded in the material on one side, wherein the material is laminated as a film. In the production of the upper wafer or the upper panel, the second structural element in a sheet molding process can be embedded in the material on one side, wherein the material is laminated as a film.

In the production of the lower wafer or the lower panel, the first structural element can be embedded in the material in a vacuum lamination press operation and the lower wafer or the lower panel is then connected with insulating material. In the production of the upper wafer or the upper panel, the second structural element can be embedded in the material in a vacuum lamination press operation and the upper wafer or the upper panel is then connected with insulating material. The insulating material can be applied using rollers, dispensing technology, jetting, or a combination of these processes.

After fastening the lower wafer or the lower panel to the upper wafer or the upper panel, the upper wafer or the upper panel can be subjected a grinding process, wherein the thickness of the upper wafer or the upper panel is reduced. In this way, the mass over the components can be reduced to a minimum and the thickness of the module is further reduced. A number of components can also be made thinner.

The present invention is described below in more detail with reference to the attached figures.

FIG. 3 shows a module which has been manufactured by stacking the lower component of a module shown in FIG. 1 and the upper component of the module shown in FIG. 2 in cross-section.

FIG. 4 shows the module shown in FIG. 3 after performing additional processing steps.

FIG. 5 shows in cross section a module according to an alternate embodiment.

Figure 1:
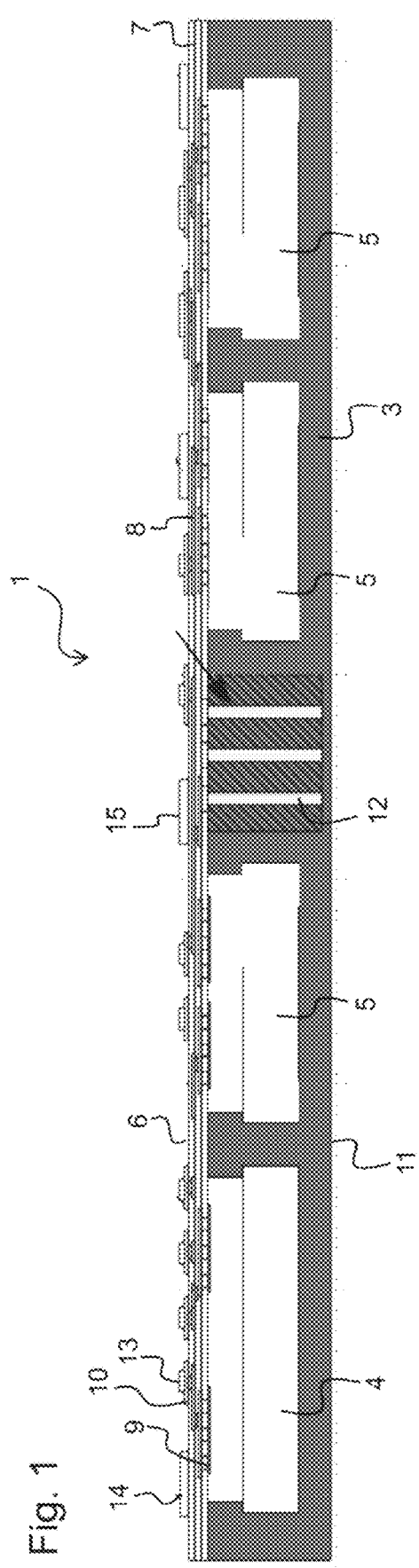
FIG. 1 shows a lower component of the module in cross-section.

FIG. 1 shows a lower component of a module 1 that can be attached to an upper component of a module 2 to form a module. A single lower component of a module 1 is shown in FIG. 1. The lower component of a module 1 along with a variety of other lower components of modules can be processed into a wafer group or panel group.

The lower component of a module 1 has a material 3 in which a first structural element 4 as well as other components 5 are embedded. Material 3 can be a molding material, an organic layered fabric, based in particular on epoxy or phenol, or a prepreg-material, for example.

For example, the first structural element 4 may be a structural element that operates with SAW waves (surface acoustic wave=SAW). Accordingly, it is an encapsulated structural element having a cavity. The lower component of module 1 is designed in such a way that various structural elements 4, 5 can be embedded in the material 3. It is thus a technology platform that allows for integration of various construction elements 4, 5 in the module.

The other structural elements 5 can be sensor chips which can be analog or digital, for example. In addition to the actual sensor element, such a sensor chip can also have logic for assessing measured data as well as a memory element. Alternatively or additionally, the other structural elements 5 can be selected from one or more of the following: a semiconductor chip with built-in active or passive circuitry, a passive structural element, a digital chip or a MEMS device.

In addition, a rewiring layer 7 is arranged on the upper side 6 of the lower component of the module. The rewiring layer 7 has a metal layer 8. The rewiring layer 7 is multi-layered, the metal layer 8 being arranged in several layers. The first structural element 4 has multiple contacts 9. These are connected to the metal layer 8 of the rewiring layer 7. The metal layer 8 connects the contacts 9 of the first structural element 4 with the contacts 10 arranged on the upper side of the rewiring layer 7. In this way, the position of contacts 10 can be adjusted in any way. In particular, the contacts 9 of the structural elements 4, 5 can be wired into a flat arrangement on the top 6 of the lower component of the module 1 so that the center distance of the contact can be significantly increased.

The lower component of the module 1 shown in FIG. 1 has no rewiring layer on its lower side 11. This is produced in a later step.

The rewiring layer 7 arranged on the top 6 of the lower component of the module 1 is electrically connected with a plated through hole 12, which extends through the lower component of the module 1.

In addition, metal columns 13 are arranged on the upper side 6 of the lower component of the module 1. The metal columns 13 can consist of copper, for example. The metal columns 13 are arranged on the contacts 10 of the rewiring layer 7 and are therefore electrically connected to the metal layer 8 of the rewiring layer 7. In conjunction with the corresponding metal columns on the lower side of the upper component of the module 2, the metal columns 13 can provide electrical contact of the two components of the modules 1, 2.

There is also a ring 14 on the upper side 6 of the lower component of the module 1. This is made of a metal, such as copper. The ring 14 provides mechanical stabilization and can be connected with a corresponding ring which is arranged on an lower side of an upper component of a module 2, for example by eutectic bonding.

In addition, on the upper side 6 of the lower component of the module 1, metallic structures 15 made of copper, for example, may be arranged that mechanically stabilize the mechanical connection between the lower and the upper component of the module 1, 2, and that are not electrically connected.

The ring 14 arranged at the edge of the upper side 6 and the other metallic structures 15 arranged in an interior area of the upper side 6 provide mechanical stabilization for the lower component of the module 1 and prevent warping.

Figure 2:
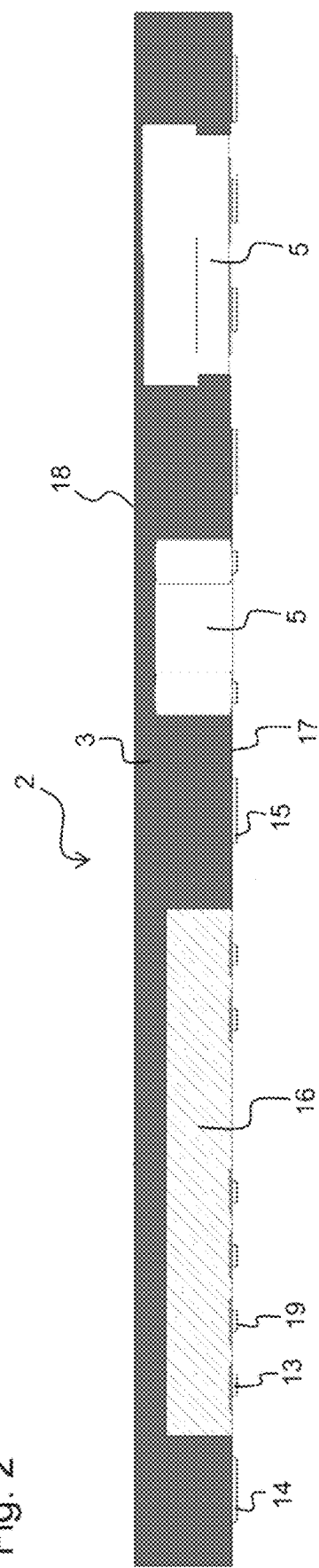
FIG. 2 shows an upper component of the module in cross-section.

FIG. 2 shows the upper component of module 2. A single upper component of a module 2 is shown in FIG. 2. The upper component of the module 2 can be produced along with a variety of other upper components of a module 2 in a wafer group or a panel group.

The upper component of the module 2 is designed to be connected with the lower component of the module 1 to form a module. The upper component of the module 2 has a structure that is similar to the lower component of the module 1. The upper component of the module 2 has a material 3 in which a second structural element 16 as well as further structural components 5 are embedded. Material 3 can be, for example, one of the above mentioned materials that are also used for the lower component of the module 1. Material 3 can be the same as the material 3 of the lower component of module 1 or can differ from this.

The upper component of the module 2 also forms a platform for the integration of different structural components 16, 5. The second structural element 16 and the other structural elements 5 can, for example, be a sensor chip, one or more selected from an analog or digital chip, a passive component or a sensor chip.

The upper component of the module 2, shown in FIG. 2, does not have a rewiring layer 7. In alternative embodiments, the upper component of the module 2 can have a single layer or multilayer rewiring layer 7 on its lower side 17 and/or on its upper side 18.

Metal columns 13 are arranged on the under side 17 of the upper component of the module 2 which can be connected to the metal columns 13 on the upper side 6 of the lower component of the module 1 in order to electrically connect the two components of the module 1, 2. The metal columns 13 are made of copper, for example, and have a coating containing tin 19 on their side facing the lower component of the module. The metal columns 13 of the lower component of the module 1 and the metal columns 13 of the upper component of the module 2 are connected by eutectic bonding, the combination of copper and tin making a connection.

Alternatively, the metal columns 13 may be coated with a conductive adhesive material instead of tin. In this case, the metal columns 13 can be glued to the corresponding metal columns of the lower component of the module 1.

On its lower side 17, the upper component of the module also has a ring 14 which is designed to connect with the ring of the lower component of the module 1. In addition, the under side 17 of the upper component of the module 2 has more metallic structures 15, which contribute to the increased mechanical stability of the module. As already discussed in connection with the lower component of the module 1, the ring 14 and the other metallic structures 15 ensure mechanical stabilization and prevent warping of the upper component of the module 2. The ring 14 and other metallic structures 15 are coated with tin to allow connection by eutectic bonding. Alternatively, these elements may be coated with an adhesive. Alternatively to connection via eutectic bonding, other connection processes are possible, for example, an Ag-sintering process or soldering.

FIG. 3 shows the module after the lower component of the module 1 of FIG. 1 was fixed to the upper component of the module 2 of FIG. 2. In this connection, a wafer or a panel that has a variety of lower components of a module 1 is attached to a wafer or panel that has a corresponding variety of upper components of a module 2.

The two components of the module 1, 2 were connected to each other by eutectic bonding. This step was completed while the two components of a module 1, 2 in each case having a variety of other components of a module 1, 2 are connected in a wafer or a composite panel. Using eutectic bonding, the rings 14, the metal columns 13 and other metallic structures 15 were connected. The metal columns 13 provide electrical contact of the two components of the module 1, 2 with each other. The rings 14 and other metallic structures 15 are mechanically connected to each other and increase the mechanical stability of the module and in this way prevent warping of the module.

In addition, an electrically insulating under-fill layer 20 is arranged between the two components of the module 1, 2. The under-fill layer 20 can consist of a conventional material or of an anisotropic conductive adhesive. It has no air pockets or voids. The under-fill layer 20 is disconnected by the structures for electrical and mechanical connection of components of the module 1, 2. These include in particular the rings 14, the other metallic structures 15 and the metal columns 13.

The under-fill layer 20 ensures that the under side 17 of the upper component of the module 1 and the upper side 6 of the lower component of the module 2 each have a uniform surface without steps. The connection of the two components of the module 1, 2 can be sealed by the under-fill layer 20.

In addition, material 3 was removed from the under side 11 of the lower component of the module 1 to expose the end of the through hole 12 directed downward. A contact layer 21 was then added to the under side 11 of the lower component of the module 1. This makes it possible for the module to make contact with a printed circuit board or similar.

Removal of the material 3 from the lower side 11 of the lower component of the module 1 was carried out only after connecting the lower component of the module 1 with the upper component of module 2, because thereafter the module has an increased mechanical stability so that the risk of breaking the module is quite low during removal of the material.

FIG. 4 shows the module shown in FIG. 3 after carrying out further steps of the manufacturing process.

The modules, which were in a wafer or panel group in FIG. 3, are now separated, for example, by a sawing process. The oblique side surfaces of the module shown in FIG. 4 resulted as a result of this.

In addition, material 3 was removed from the upper side 18 of the upper component of the module 2. In particular, the upper component of the module 2 was thinned using a grinding process. In this way, the thickness of the materials 3 was reduced over the structural elements 5, 16. In addition, cuts were inserted, which were used for plated through holes.

Metallizations 22, 23, 24 are applied on the upper side 18 of the upper component of the module 2. Metallization 22 forms an antenna structure. Metallization 23 is used for the cooling of the module. Metallization 24 serves to protect against electrostatic discharge. In addition, a thermal via 25 is proposed that is intended to conduct heat produced to the upper side 18 of the module.

With the thinning, the second structural element 16 was exposed so that its upper side is not covered by the material 3. Instead, metallization 23 is now arranged on the upper side of the second structural element 16, which serves to cool the second structural element 16.

FIG. 5 shows a module in accordance with an alternate embodiment. The module shown in FIG. 5 is different from the previously shown module in that a rewiring layer 7 is arranged on the upper side 18 of the upper component of the module 2 and in that plated through holes 12 are provided in the upper component of the module which contact the rewiring level 7 arranged on the upper side 18 of the upper component of the module 2 with a contact arranged on the lower side 17. The plated through holes 12 are embedded Z lines.

The rewiring layer 7 arranged on the upper side 18 of the upper component of the module 2 form an antenna structure.

In the module shown in FIG. 5, the upper component of the module 2 was not thinned.

LIST OF REFERENCE NUMERALS 1 lower component of the module
2 upper component of the module
3 material
4 first structural element
5 another structural element
6 upper side of the lower component of the module
7 rewiring layer
8 metal layer
9 contact of the first structural element
10 contact of rewiring layer
11 lower side of the lower component of the module
12 plated through hole
13 metal column
14 ring
15 metallic structures
16 second structural element
17 lower side of the upper component of the module
18 upper side of the upper component of the module
19 coating
20 under-fill layer
21 contact layer
22 Metallization
23 Metallization
24 Metallization
25 thermal via

The invention claimed is:

1. A module comprising:
a lower component of the module having a first material in which at least a first structural element is embedded, and
an upper component of the module having a second material in which at least a second structural element is embedded,
wherein at least one of the first structural element and the second structural element is a semiconductor chip with built-in active or passive circuitry, a passive structural element, a sensor, a digital chip, a microelectromechanical systems (MEMS) device, or an acoustic wave filter,
wherein the upper component of the module and the lower component of the module are stacked on top of one another,
wherein the lower and the upper components of the module are in electrical connection and are mechanically connected,
wherein at least one of the lower and upper components of the module, on a side facing the other of the lower and upper component of the module, has a first rewiring layer having a metal coating, by means of which the lower and upper components are electrically connected together; and
wherein the upper component of the module has a second rewiring layer on its upper side directed away from the lower component of the module and has a metallization that forms both an antenna structure as well as passive elements that are connected with the second structural element.

2. The module of claim 1, wherein at least one of the components of the module, on its under side and on its opposite upper side has a rewiring layer, wherein the rewiring layers are connected with a plated through hole that extends through the component of the module.

3. The module of claim 1,
wherein the lower component of the module has metal columns on an upper side facing the upper component of the module,
wherein the upper component of the module has metal columns on its under side facing the lower component of the module, and
wherein the metal columns of the lower component of the module and the metal columns of the upper component of the module are connected.

4. The module of claim 1, wherein the first or second material is a prepreg material or a molding material.

5. A module comprising:
a lower component of the module having a first material in which at least a first structural element is embedded, and
an upper component of the module having a second material in which at least a second structural element is embedded,
a metallization arranged on an exterior surface of the module which allows an electromagnetic shielding of the module or which is used to dissipate heat from the module,
wherein the upper component of the module and the lower component of the module are stacked on top of one another,
wherein the lower and the upper components of the module are in electrical connection and are mechanically connected, and
wherein at least one of the components of the module, on a side facing the other component of the module, has a rewiring layer having a metal coating, by means of which the module components are electrically connected together.

6. The module of claim 5, wherein:
the metallization that forms an antenna structure arranged on an exterior surface of the module.

7. The module of claim 5, wherein the first and/or the second structural element is selected from a semiconductor chip with built-in active or passive circuitry, a passive structural element, a sensor, a digital chip, or a microelectromechanical systems (MEMS) device.

8. A module comprising:
a lower component of the module having a first material in which at least a first structural element is embedded, and
an upper component of the module having a second material in which at least a second structural element is embedded, the upper component being electrically and mechanically connected to the lower component,
wherein the upper component has a rewiring layer having a metal coating that forms an antenna structure connected with the second structural element,
wherein the upper component and the lower component are stacked on top of one another, and
wherein an acoustic wave filter is the first structural element and/or the second structural element.

9. A module comprising:
a lower component having a first structural element embedded in a first material,
an upper component, mechanically connected to and stacked on the lower component, having second structural element embedded in a second material, wherein at least one of the first structural element and the second structural element is a semiconductor chip with built-in active or passive circuitry, a passive structural element, a sensor, a digital chip, a microelectromechanical systems (MEMS) device, or an acoustic wave filter, wherein at least one of the lower and upper components of the module has, on a side facing the other of the lower and upper component of the module, a first rewiring layer having a metal coating, by means of which the lower and upper components are electrically connected together, and a second rewiring layer on an opposite upper side, and wherein the first and second rewiring layers are connected with a plated through hole that extends through the component of the module.

10. A module comprising:

a lower component having a first structural element embedded in a first material, an upper component, mechanically connected to and stacked on the lower component, having second structural element embedded in a second material, wherein at least one of the first structural element and the second structural element is a semiconductor chip with built-in active or passive circuitry, a passive structural element, a sensor, a digital chip, a microelectromechanical systems (MEMS) device, or an acoustic wave filter, wherein at least one of the lower and upper components of the module, on a side facing the other of the lower and upper component of the module, has a first rewiring layer having a metal coating, by means of which the lower and upper components are electrically connected together; and wherein the lower component of the module has metal columns on an upper side facing the upper component of the module, wherein the upper component of the module has metal columns on an under side facing the lower component of the module, and wherein the metal columns of the lower component of the module and the metal columns of the upper component of the module are connected.

\* \* \* \* \*